US012753492B2

(12) United States Patent
Poteet et al.

(10) Patent No.: US 12,753,492 B2
(45) Date of Patent: Oct. 6, 2026

(54) METHOD OF FORMING SILICON CARBIDE CONVERSION COAT ON CARBON USING GAS PHASE REACTIONS

(71) Applicant: Goodrich Corporation, Charlotte, NC (US)

(72) Inventors: Steven Poteet, Lake Forest, CA (US); Paul T. Perea, Pueblo West, CO (US); John S. Linck, Pueblo, CO (US); Kirk Christopher Newton, Vail, AZ (US); Garth Wilks, Kettering, OH (US)

(73) Assignee: Goodrich Corporation, Charlotte, NC (US)

( * ) Notice: Subject to any disclaimer, the term of this patent is extended or adjusted under 35 U.S.C. 154(b) by 149 days.

(21) Appl. No.: 18/470,323

(22) Filed: Sep. 19, 2023

(65) Prior Publication Data

US 2025/0092512 A1 Mar. 20, 2025

(51) Int. Cl.

| | |
|---|---|
| ***C23C 16/32*** | (2006.01) |
| ***C23C 16/02*** | (2006.01) |
| ***C23C 16/448*** | (2006.01) |
| ***C23C 16/46*** | (2006.01) |
| ***C23C 16/56*** | (2006.01) |

(52) U.S. Cl.

CPC ........ *C23C 16/325* (2013.01); *C23C 16/0272* (2013.01); *C23C 16/448* (2013.01); *C23C 16/46* (2013.01); *C23C 16/56* (2013.01)

(58) Field of Classification Search

None

See application file for complete search history.

(56) References Cited

U.S. PATENT DOCUMENTS

| | | | |
|---|---|---|---|
| 4,425,407 | A | 1/1984 | Galasso et al. |
| 4,513,030 | A | 4/1985 | Milewski |
| 4,585,675 | A | 4/1986 | Shuford |
| 4,830,919 | A | 5/1989 | Shuford |
| 5,525,372 | A | 6/1996 | Sayles |
| 5,618,510 | A | 4/1997 | Okada et al. |
| 5,705,262 | A | 1/1998 | Bou et al. |
| 7,547,360 | B2 | 6/2009 | Gupta et al. |

(Continued)

FOREIGN PATENT DOCUMENTS

| | | |
|---|---|---|
| CN | 110357635 | 9/2021 |
| JP | 03853058 | 12/2006 |
| WO | 9117839 | 11/1991 |

OTHER PUBLICATIONS

European Patent Office, European Partial Search Report dated Mar. 26, 2025 in Application No. 24201184.9.

(Continued)

*Primary Examiner* — Shamim Ahmed
*Assistant Examiner* — Bradford M Gates
(74) *Attorney, Agent, or Firm* — SNELL & WILMER L.L.P

(57) ABSTRACT

A method for forming a bi-layer coating on a substrate is disclosed herein. The method includes placing the substrate in a chemical vapor deposition (CVD) furnace, the substrate including a surface, applying a reactant vapor to the surface of the substrate to form a first coating, applying methyl trichlorosilane (MTS) to the substrate after applying the reactant vapor to the substrate, and heating the CVD furnace, including the substrate, to a first temperature to form a second coating.

6 Claims, 7 Drawing Sheets

(56) References Cited

U.S. PATENT DOCUMENTS

| | | | |
|---|---|---|---|
| 9,085,493 | B2 | 7/2015 | Nakamura et al. |
| 10,934,172 | B2 | 3/2021 | Villalobos et al. |
| 10,954,167 | B1 | 3/2021 | Garnier et al. |
| 11,718,569 | B2 | 8/2023 | Ootsuka et al. |
| 2010/0310860 | A1 | 12/2010 | Jung et al. |
| 2014/0161978 | A1 | 6/2014 | Choi et al. |
| 2016/0024648 | A1 | 1/2016 | Bolton |
| 2021/0017092 | A1 | 1/2021 | Guercio et al. |
| 2021/0078910 | A1* | 3/2021 | Ootsuka ................ C04B 35/565 |
| 2022/0412243 | A1* | 12/2022 | Takahashi ................ B01J 35/57 |

OTHER PUBLICATIONS

European Patent Office, European Search Report dated Jun. 20, 2025 in Application No. 24201184.9.

* cited by examiner

METHOD OF FORMING SILICON CARBIDE CONVERSION COAT ON CARBON USING GAS PHASE REACTIONS

FIELD

The present disclosure generally relates to forming a coating on a substrate, and more particularly, to forming a silicon carbide coating on a carbon-carbon material.

BACKGROUND

Carbon/Carbon (C/C) materials are used in high stress environments that experience extreme temperatures (e.g., >2500° F.). Due to these extreme temperatures, the C/C typically requires a protective coating in order to prevent degradation of the C/C. Traditionally, a silicon-carbide (SiC) coating may be used to protect the C/C material. However, the SiC coating and the C/C material have a different coefficient of thermal expansion (CTE). That is, under the extreme temperatures experienced, the C/C material and the SiC coating tend to expand at different rates. The C/C material has a low CTE that tends to expand slightly, or not at all, while the SiC coating has a higher CTE that tends to expand at a higher rate, which may be associated with failure in the coating.

SUMMARY

Disclosed herein is a method for forming a bi-layer coating on a substrate. The method includes placing the substrate in a chemical vapor deposition (CVD) furnace, the substrate including a surface, applying a reactant vapor to the surface of the substrate to form a first coating, applying methyl trichlorosilane (MTS) to the substrate after applying the reactant vapor to the substrate, and heating the furnace, including the substrate, to a first temperature to form a second coating.

In various embodiments, the first temperature is about 1200° C. to about 2000° C. In various embodiments, the applying the reactant vapor further includes placing a reactant powder in a gasification furnace, heating the gasification furnace to a second temperature to form the reactant vapor, and starting a first flow of the reactant vapor from the gasification furnace to the CVD furnace. In various embodiments, the method further includes stopping the first flow of the reactant vapor from the gasification furnace to the CVD furnace and starting a second flow of the MTS to the furnace to form the second coating.

In various embodiments, the reactant powder includes silicon dioxide ($SiO_2$), a reducing agent such as activated carbon (C) or silicon (Si), and an oxygen getter, such as silicon carbide (SiC) to prevent in-situ oxidation of the substrate, or silicon nitride ($Si_3N_4$). In various embodiments, the applying the reactant vapor further includes placing a tooling in the furnace and heating the furnace to a second temperature to form the reactant vapor. In various embodiments, the method further includes starting a flow of the MTS into the furnace before heating the furnace to the first temperature.

Also disclosed herein is a method for forming a coating directly on a substrate. The method includes receiving the substrate including a surface, applying a resin, such as phenolic, to the surface of the substrate, the resin making the surface of the substrate tacky, applying a reactant powder to the surface of the substrate, the reactant powder sticking to the resin on the surface of the substrate, and applying heat to the substrate and the reactant powder, the heat having a first temperature, the heat burning the resin and causing the reactant powder to react with the substrate to form the coating.

In various embodiments, the first temperature is about 1200° C. to about 2000° C. In various embodiments, the substrate includes a carbon-carbon material. In various embodiments, the reactant powder includes silicon dioxide ($SiO_2$), a reducing agent such as activated carbon (C) or silicon (Si), and an oxygen getter, such as silicon carbide (SiC) to prevent in-situ oxidation of the substrate, or silicon nitride ($Si_3N_4$).

In various embodiments, the applying the resin includes painting, spraying, dipping, or flowing the resin onto the substrate. In various embodiments, the applying the reactant powder includes spraying, blowing, or flowing the reactant powder onto the substrate.

Also disclosed herein is a method for forming a coating on a substrate. The method includes receiving the substrate including a surface, mixing a reactant powder in a solvent to form a slurry, the solvent being a low-char solvent, applying the slurry directly to the surface of the substrate, the slurry sticking to the surface of the substrate, and applying heat to the substrate and the slurry, the heat having a first temperature, the heat burning the solvent and causing the reactant powder to react with the substrate to form the coating.

In various embodiments, the first temperature is about 1200° C. to about 2000° C. In various embodiments, the substrate includes a carbon-carbon material. In various embodiments, the reactant powder includes silicon dioxide ($SiO_2$), a reducing agent such as activated carbon (C) or silicon (Si), and an oxygen getter, such as silicon carbide (SiC) to prevent in-situ oxidation of the substrate, or silicon nitride ($Si_3N_4$).

In various embodiments, the solvent includes furfuryl alcohol. In various embodiments, the applying the slurry includes painting, spraying, dipping, or flowing the slurry onto the substrate. In various embodiments, the applying the slurry includes dipping the substrate in the slurry.

The foregoing features and elements may be combined in any combination, without exclusivity, unless expressly indicated herein otherwise. These features and elements as well as the operation of the disclosed embodiments will become more apparent in light of the following description and accompanying drawings.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the following detailed description and claims in connection with the following drawings. While the drawings illustrate various embodiments employing the principles described herein, the drawings do not limit the scope of the claims.

DETAILED DESCRIPTION

Figure 1A:
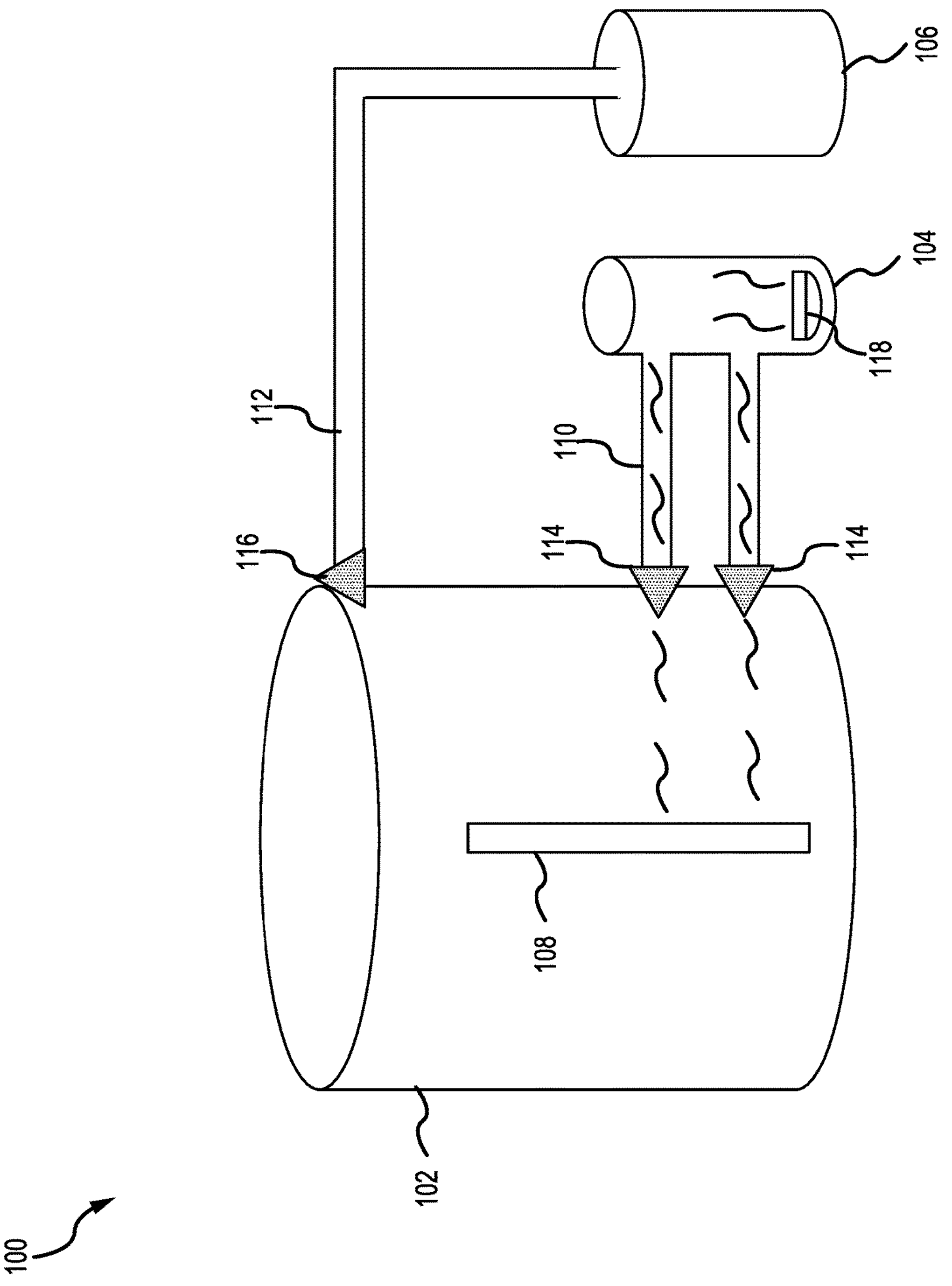
FIGS. 1A and 1B illustrate a system for forming a coating on a substrate, in accordance with various embodiments.

The following detailed description of various embodiments herein makes reference to the accompanying drawings, which show various embodiments by way of illustration. While these various embodiments are described in sufficient detail to enable those skilled in the art to practice the disclosure, it should be understood that other embodiments may be realized and that changes may be made without departing from the scope of the disclosure. Thus, the detailed description herein is presented for purposes of illustration only and not of limitation. While these exemplary embodiments are described in sufficient detail to enable those skilled in the art to practice the invention, it should be understood that other embodiments may be realized and that logical, chemical and mechanical changes may be made without departing from the spirit and scope of the invention. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected, or the like may include permanent, removable, temporary, partial, full or any other possible attachment option. Additionally, any reference to without contact (or similar phrases) may also include reduced contact or minimal contact. It should also be understood that unless specifically stated otherwise, references to "a," "an" or "the" may include one or more than one and that reference to an item in the singular may also include the item in the plural. Further, all ranges may include upper and lower values and all ranges and ratio limits disclosed herein may be combined.

Carbon/Carbon (C/C) materials are used in high stress environments that experience extreme temperatures (e.g., >2500° F.). Due to these extreme temperatures, the C/C typically requires a protective coating in order to prevent degradation of the C/C. Traditionally, a silicon-carbide (SiC) coating may be used to protect the C/C material. However, the SiC coating and the C/C material have a different coefficient of thermal expansion (CTE). That is, under the extreme temperatures experienced, the C/C material and the SiC coating tend to expand at different rates. The C/C material has a low CTE that tends to expand slightly, or not at all, while the SiC coating has a higher CTE that tends to expand at a higher rate. This difference in CTE between the two materials tends to be associated with failure in the coating. Improvements to the process of applying the SiC coating may reduce the effect of the CTE difference.

Disclosed herein are methods and processes for forming an interface layer, also referred to as the first coating, between the C/C material and the SiC coating, also referred to as the second coating, that improves the adhesion of the SiC coating to the C/C material. In various embodiments, the methods disclosed here tend to decrease the failure of the SiC coating (e.g., separating from the C/C material). In various embodiments, the interface layer may optimize the adhesion of the SiC coating to the C/C material (similar to a primer layer) while tending to decrease the effects of the CTE difference between the C/C material and the SiC coating.

In various embodiments, the methods and processes disclosed herein allow for gas phase reaction with a reduced touch time and controlled process conditions. The reduced touch time and controlled processes may, in various embodiments, increase the consistency of the C/C material and SiC coating and decrease the failure rate of the SiC coating on the C/C material. In various embodiments, the methods may include first creating a tacky surface of the C/C material. That is, making the surface of the C/C material adhesive, gummy, or sticky. In various embodiments, tackifying the surface of the C/C material may include using a low char yield system to adhere a powder to the surface of the C/C material. That is, a compound or chemical that burns, or decomposes, in response to heat, or another reagent, so that little to no material remains after being exposed to heat. In various embodiments, tackifying the surface of the C/C material may include applying a slurry including a powder and low char solvents to the surface. That is, a solvent that burns, or decomposes, in response to heat, or another reagent, so that little to no material remains after being exposed to heat. In various embodiments, a flow of reactant gasses may be introduced into a reaction chamber to coat the surface of the C/C material allowing the reactant gasses to react with the C/C material. In various embodiments, the reactant gasses may be formed by heating reactant powders to a high temperature to induce thermal decomposition. In various embodiments, the reactant powder, and by extension the reactant gasses, may include a chemical that reacts with the surface of the C/C material.

In various embodiments, a methyl trichlorosilane (MTS) gas may be introduced to the C/C material after the first coating to form a second coating. As will be discussed in further detail below, an important aspect of the methods and processes disclosed herein, in their various embodiments, is the focus on bringing a chemical, powder, gas, or other product to the surface of the C/C material and not merely within the vicinity of the surface. In other words, the methods disclosed herein, in their various embodiments, improve the process of delivering a powder, a gas, or another chemical component to the surface of the C/C material and thereby improves the formation of a coating on the substrate.

The methods and processes as disclosed herein, in various embodiments, improve the processing and coating of C/C material. In various embodiments, the methods disclosed herein eliminate free silicon (Si) from the interface layer. That is, the interface layer does not include free Si atoms, and/or is substantially free of Si atoms. In various embodiments, a more consistent processing is achieved by driving a single reaction with carbon as opposed to multiple separate reactions. In various embodiments, the methods disclosed herein reduce "touch time" between applying the interface layer and applying the SiC coating.

Figure 1B:
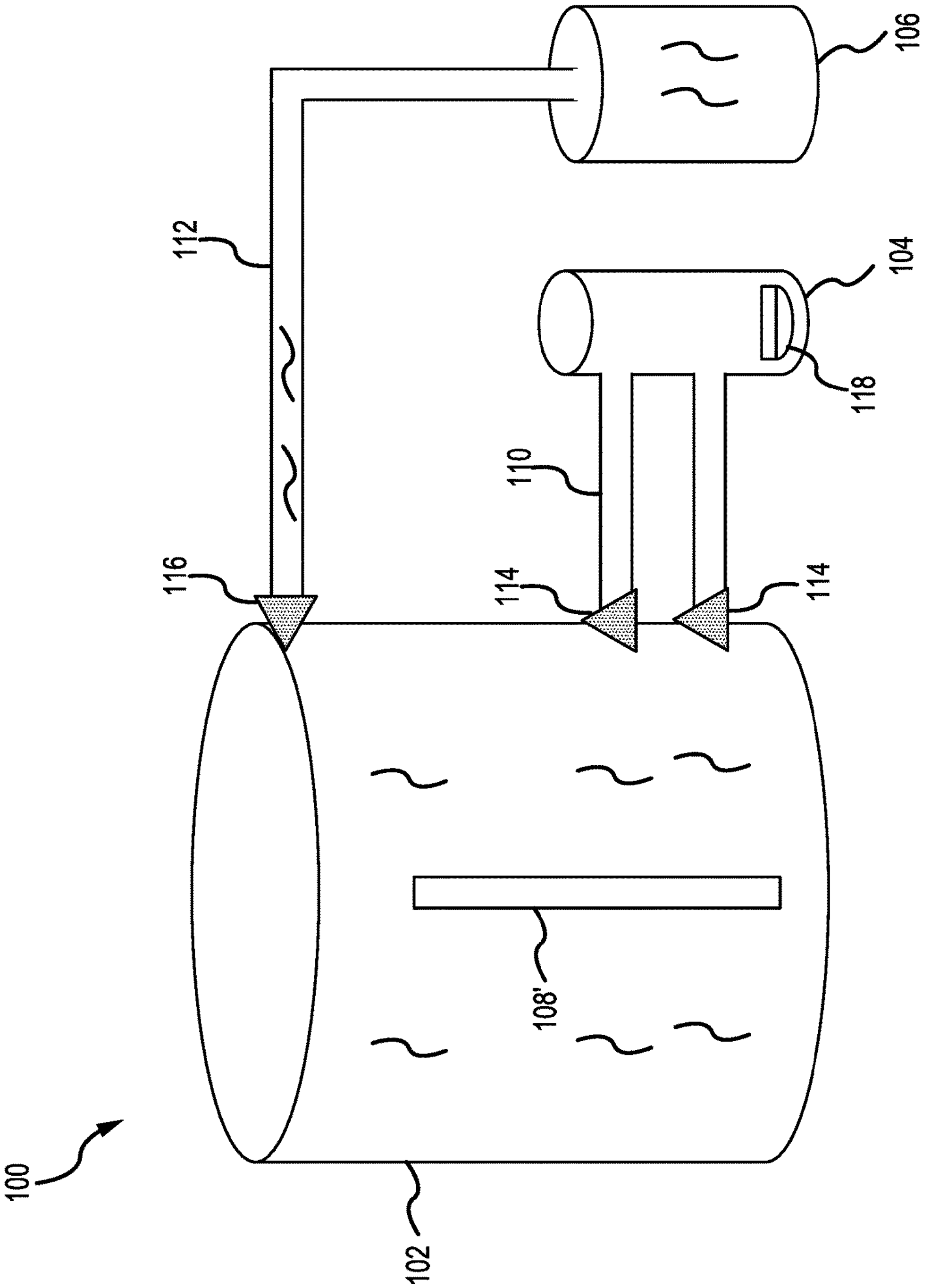

Referring now to FIGS. 1A and 1B, a system 100 for forming a bi-layer coating over a substrate is illustrated, in accordance with various embodiments. System 100 includes a chemical vapor deposition (CVD) furnace 102, a gasification furnace 104, a methyl trichlorosilane (MTS) furnace 106, a substrate 108, a first conduit 110, a second conduit 112, a first valve 114, a second valve 116, and a powder 118. Substrate 108 is disposed within CVD furnace 102. Powder 118 is disposed within gasification furnace 104. Gasification furnace 104 and MTS furnace 106 are each coupled to CVD furnace 102. In various embodiments, substrate 108 may be a rectangular shape, as illustrated in FIGS. 1A and 1B. In various embodiments, substrate 108 may be any shape and/or may have any configuration or number of components. In various embodiments, substrate 108 may be a carbon-carbon (C/C) material. In various embodiments, substrate 108 may be a reinforced C/C material. In various embodiments, powder 118 may include silicon dioxide ($SiO_2$). In various embodiments, powder 118 may include a reducing agent such as activated carbon (C) or silicon (Si), and an oxygen getter, such as silicon carbide (SiC). In various embodiments, powder 118 may include silicon nitride ($Si_3N_4$).

First conduit 110 couples gasification furnace 104 to CVD furnace 102. In various embodiments, first conduit 110 may include more than one conduit. Second conduit 112 couples MTS furnace 106 to CVD furnace 102. In various embodiments, second conduit 112 may include more than one conduit. First valve 114 couples first conduit 110 to CVD furnace 102 and is configured to move from a closed position to an open position. When in the closed position, first valve 114 isolates CVD furnace 102 from first conduit 110 and gasification furnace 104. In various embodiments, first valve 114 may include more than one valve. Second valve 116 couples second conduit 112 to CVD furnace 102 and is configured to move from a closed position to an open position. When in the closed position, second valve 116 isolates CVD furnace 102 from second conduit 112 and MTS furnace 106. In various embodiments, second valve 116 may include more than one valve.

FIG. 1A illustrates system 100 with first valve 114 in the open position and second valve 116 in the closed position during a first step of forming a first coating over substrate 108. During the first step, gasification furnace 104 is heated to a first temperature that converts powder 118 to a gas. The first temperature may be about 1200° C. to about 2000° C., and more specifically, about 1600° C. The temperature in gasification furnace 104 (i.e., the first temperature) converts powder 118 to a gas that flows through first conduit 110 and into CVD furnace 102 through first valve 114, which is in the open state. The gas flow is able to contact the surfaces of substrate 108 and thereby form the first coating, or interface layer, on substrate 108, resulting in substrate 108', shown in FIG. 1B. The first coating serves to improve adhesion of a second coating (e.g., SiC coating) onto substrate 108.

FIG. 1B illustrates system 100 with first valve 114 in the closed position and second valve 116 in the open position during a second step of forming the second coating over substrate 108. With second valve 116 open, MTS is flowed into CVD furnace 102 to react with the first coating. CVD furnace 102 is heated to a second temperature to promote the formation of the second coating on substrate 108'. The second temperature may be about 1200° C. to about 2000° C., and more specifically, about 1600° C.

Figure 2:
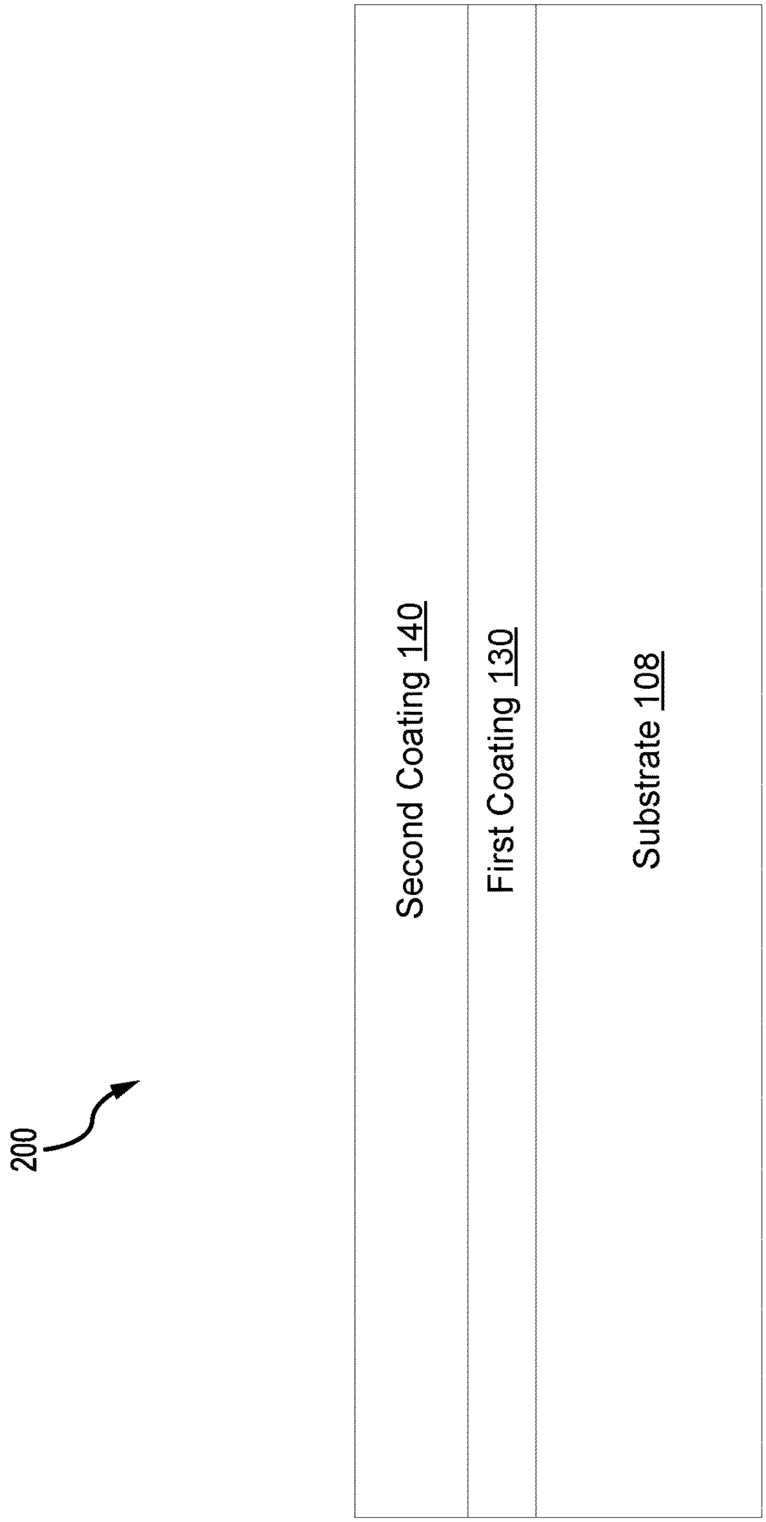
FIG. 2 illustrates a substrate including a first coating and a second coating, in accordance with various embodiments.

Referring now to FIG. 2, a cross section of C/C material 200 including a first coating and a second coating as described above is illustrated, in accordance with various embodiments. C/C material 200 includes a substrate 108, a first coating 130, and a second coating 140. Substrate 108', as described above in FIG. 1B, includes substrate 108 and first coating 130. First coating 130 has a first thickness and second coating 140 has a second thickness. In various embodiments, the first thickness may be about 5% to about 20% of the second thickness, and more specifically, about 10% to about 15% of the second thickness. In various embodiments, first coating 130 may be disposed around substrate 108 so that substrate 108 is encompassed by, or entirely disposed within, first coating 130. In various embodiments, second coating 140 may be disposed over first coating 130 so that first coating 130 is encompassed by, or entirely disposed within, second coating 140.

Figure 3:
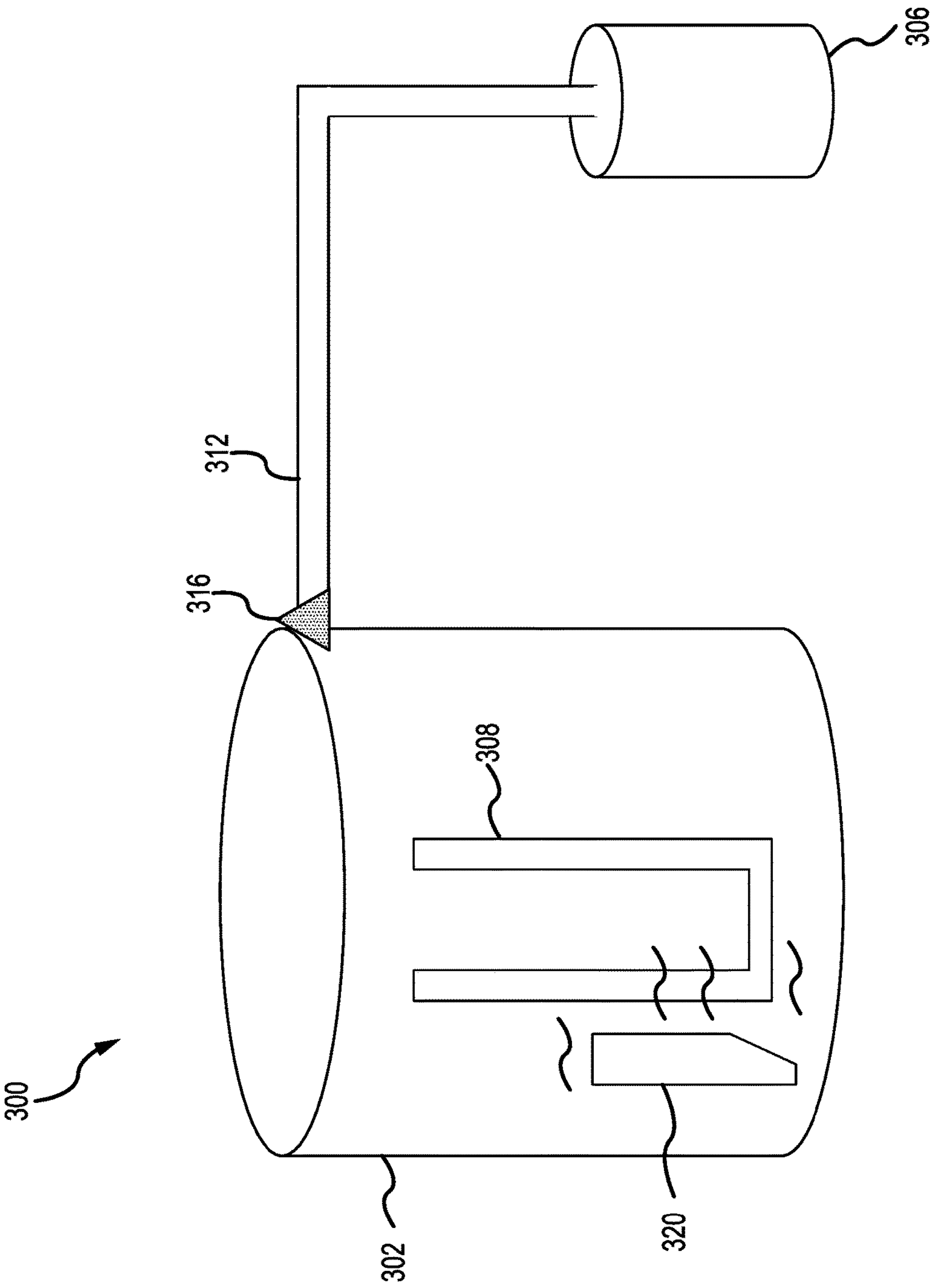
FIG. 3 illustrates a system for forming a coating on a substrate, in accordance with various embodiments.

Referring now to FIG. 3, a system 300 for forming a coating over a substrate is illustrated, in accordance with various embodiments. System 300 includes similar components to system 100 described in FIGS. 1A and 1B, including a chemical vapor deposition (CVD) furnace 302, a methyl trichlorosilane (MTS) furnace 306, a substrate 308, a first conduit 312, and a first valve 316, descriptions of which may not be repeated below. Substrate 308 may be similar material to substrate 108 described above. In various embodiments, substrate 308 may be a carbon-carbon (C/C) material. In various embodiments, substrate 308 may be a reinforced C/C material. In various embodiments, substrate 308 may be the same shape as substrate 108 illustrated in FIGS. 1A and 1B. In various embodiments, substrate 308 may be any number of shapes, such as a U-shaped material as illustrated in FIG. 3.

System 300 further includes a tooling 320 that is disposed within CVD furnace 302 and adjacent substrate 308. Tooling 320 may, in various embodiments, be formed of the similar material to powder 118, described above. Tooling 320 may be formed, in various embodiments, into any number of shapes and/or sizes. In various embodiments, tooling 320 may be configured to contact substrate 308. In various embodiments, tooling 320 may be configured to be adjacent tooling 320 without contacting substrate 308. In various embodiments, tooling 320 may include silicon dioxide ($SiO_2$). In various embodiments, tooling 320 may include, a reducing agent such as activated carbon (C) or silicon (Si), and an oxygen getter, such as silicon carbide (SiC). In various embodiments, tooling 320 may include silicon nitride ($Si_3N_4$).

System 300 may perform the coating process in two steps, similar to system 100. During the first step, first valve 316 is in the closed position and CVD furnace 302 is heated to a first temperature that converts portions of tooling 320 to a gas. The first temperature may be about 1200° C. to about 2000° C., and more specifically, about 1600° C. In various embodiments, convection within CVD furnace 302 may circulate the gas so that the gas contacts all or substantially all surfaces of substrate 308. In various embodiments, a fan, or similar mechanism, may circulate the gas within CVD furnace 302 so that the gas contacts all or substantially all surfaces of substrate 308. This forms an interface layer (e.g., first coating 130) over substrate 308.

During the second step, first valve 316 is moved to the open position while CVD furnace 302 is heated. The MTS is flowed from MTS furnace 306 and into CVD furnace 302. The MTS reacts with the first coating and forms a CVD coating (e.g., second coating 140) over the interface layer.

Figure 4:
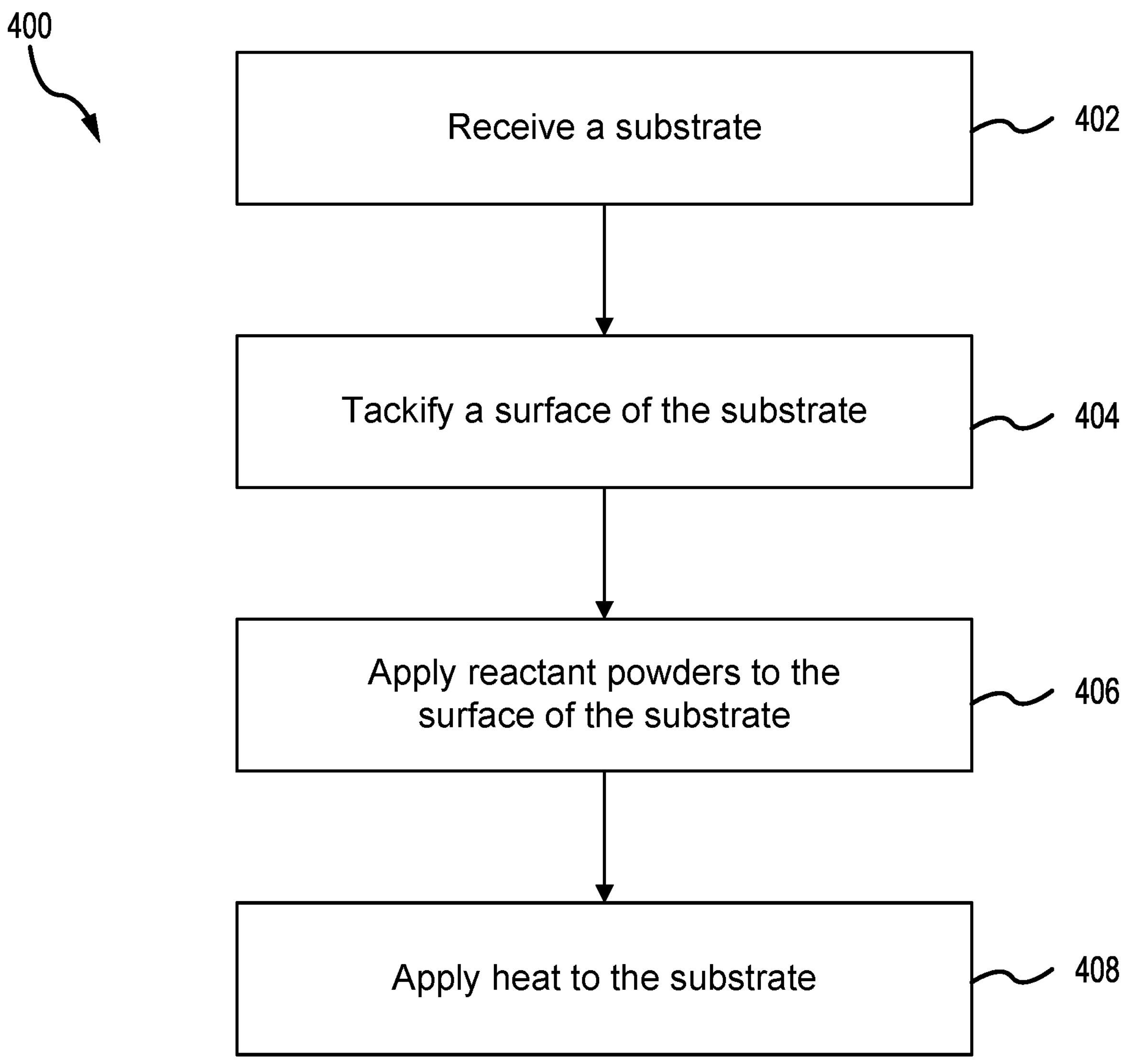
FIG. 4 illustrates a method for forming a coating on a substrate, in accordance with various embodiments.

Referring now to FIG. 4, a method 400 for forming a coating over a substrate is illustrated, in accordance with various embodiments. Method 400 may be performed using a chemical vapor deposition (CVD) system, such as system 100 or system 300 described above in FIGS. 1A, 1B, and 3. In various embodiments, the steps of method 400 may result in C/C material 200 described above in FIG. 2, including substrate 108, first coating 130, and second coating 140.

At block 402, a substrate is received. In various embodiments, the substrate may be substrate 108 described above in FIGS. 1A and 1B. In various embodiments, the substrate may be substrate 308 described above in FIG. 3. In various embodiments, the substrate may be a simple shape such rectangular, circular, triangular, U-shaped, among others. In various embodiments, the substrate may be a complex shape including multiple different portions, angles, and surfaces. In various embodiments, the substrate may be a carbon-carbon (C/C) material.

At block 404, the surface of the substrate is tackified. That is, the surface of the substrate is made tacky, sticky, gummy, or otherwise adhesive. In various embodiments, the substrate may be coated in a resin, other similar material, that interacts with the surface of the substrate to make the surface tacky, or sticky. In various embodiments, the resin may be tailored to a specific viscosity depending on the geometry of the substrate. In various embodiments, the resin may be tailored to burn off, or in other words, decompose into a gaseous state at high temperatures, providing a low-char yield. That is, after decomposing, little to no resin remains on the surface of the substrate. In various embodiments, the substrate may be placed into and/or dipped into the resin to coat all or substantially all surfaces of the substrate. In various embodiments, the resin may be blown onto the substrate (e.g., being propelled by air, for example, by using a compressor). Specifically, the resin is applied in a manner that allows the resin to cover the entire surface of the substrate including edges, corners, and non-planar features of the component.

At block 406, a reactant powder is applied to the surface of the substrate. In various embodiments, the reactant powder may be powder 118 described above in system 100. In various embodiments, the reactant powder may include similar material to tooling 320 described above in system 300. In various embodiments, the reactant powder may include silicon dioxide ($SiO_2$), a reducing agent such as activated carbon (C) or silicon (Si), and an oxygen getter, such as silicon carbide (SiC) to prevent in-situ oxidation of the substrate, or silicon nitride ($Si_3N_4$), among others. The reactant powder is applied to the surface of the substrate, and more specifically, to the resin disposed on the surface of the substrate. The tacky surface of the substrate holds and secures the reactant powder on the substrate. The tacky surface enables the reactant powder to thoroughly coat the surface of the substrate. In various embodiments, a flow of the reactant powder may be blown onto the surface of the substrate. In various embodiments, tooling may be used to apply the reactant powder to the substrate. In various embodiments, the substrate may submerged in the reactant powder such that the reactant powder coats all portions of the surface of the substrate upon removal from the reactant powder.

At block 408, heat is applied to the substrate including the resin and the reactant powder. In various embodiments, the material including the substrate, the resin, and the reactant powder may be placed in a chemical vapor deposition (CVD) furnace (e.g., CVD furnace 102) and be heated to a first temperature. The first temperature may be about 1200° C. to about 2000° C., and more specifically, about 1400° C. to about 1800° C., and more specifically about 1600° C., with a margin of error of 5%. The reactant powder that is stuck to the surface of the substrate reacts with the substrate in response to the first temperature. Specifically, the reactant powders turn to gas in response to the first temperature and the gas reacts with the carbon of the substrate to form SiC on the surface of the substrate. That is, the chemical reaction between the reactant powders and the preform cause a conversion of the reactant powder to form a first coating (e.g., first coating 130) over the substrate. During this process, the resin may burn off, resulting in a low-char yield of the resin material. That is, the mass of the resin after application of the first temperature is low as compared to the original mass of the resin. A low-char yield may be about 5% to about 15% of the original mass, and more specifically, about 10% of the original mass.

Figure 5:
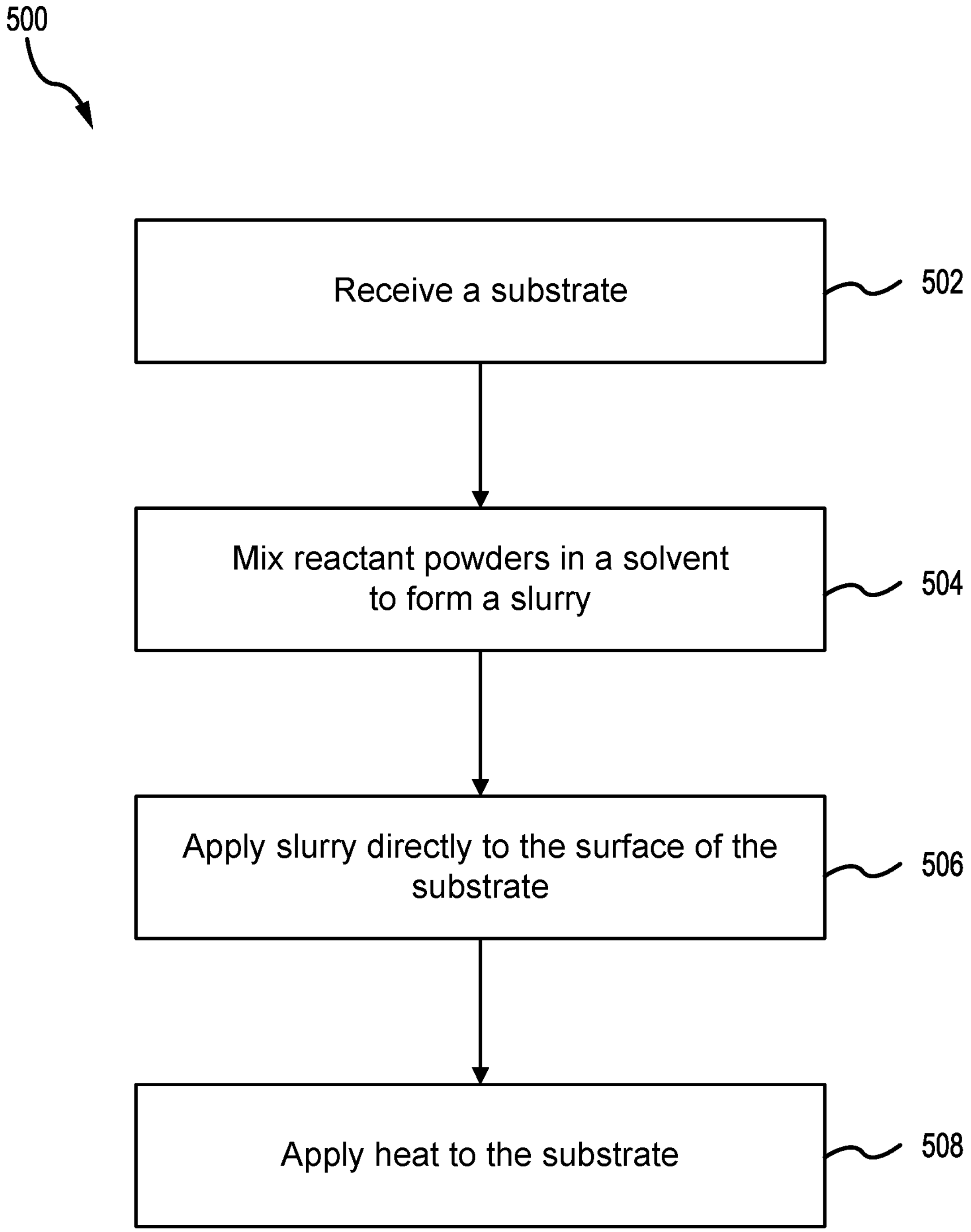
FIG. 5 illustrates a method for forming a coating on a substrate, in accordance with various embodiments.

Referring now to FIG. 5, a method 500 for forming a coating over a substrate is illustrated, in accordance with various embodiments. Method 500 may be performed using a chemical vapor deposition (CVD) system, such as system 100 or system 300 described above in FIGS. 1A, 1B, and 3. In various embodiments, the steps of method 500 may result in C/C material 200 described above in FIG. 2, including substrate 108, first coating 130, and second coating 140.

At block 502, a substrate is received. In various embodiments, the substrate may be substrate 108 described above in FIGS. 1A and 1B. In various embodiments, the substrate may be substrate 308 described above in FIG. 3. In various embodiments, the substrate may be a simple shape such rectangular, circular, triangular, U-shaped, among others. In various embodiments, the substrate may be a complex shape including multiple different portions, angles, and surfaces. In various embodiments, the substrate may be a carbon-carbon (C/C) material.

At block 504, a slurry is formed by mixing a reactant powder in a solvent. In various embodiments, the reactant powder may be powder 118 described above in system 100. In various embodiments, the reactant powder may include similar material to tooling 320 described above in system 300. In various embodiments, the reactant powder may include silicon dioxide ($SiO_2$), a reducing agent such as activated carbon (C) or silicon (Si), and an oxygen getter, such as silicon carbide (SiC) to prevent in-situ oxidation of the substrate, or silicon nitride ($Si_3N_4$), among others. In various embodiments, the solvent may be a low-char solvent such as furfuryl alcohol, isopropanol, ethanol, mineral spirits, or xylitol mother liquor, among others. The viscosity of the slurry may be tailored based on the geometric constraints of the substrate. That is, a more viscous slurry may be used on a substrate that is more geometrically complex and a less viscous slurry may be used on a substrate that is less geometrically complex. In various embodiments, the SiC/$SiO_2$ ratio may be about 5:1 to about 20:1 or about 10:1 to about 15:1. In various embodiments, ratio of reactant power to solvent may be about 1:0.8 to about 1:1.2, and more specifically, about 1:1.

At block 506, the slurry is applied to the substrate. Specifically, the slurry may be applied directly to the surface of the substrate. That is, the reactant powders are carried directly to the surface of the substrate by the slurry. In various embodiments, the surface of the substrate may become sticky, or tacky, after the slurry is applied. In various embodiments, the slurry may be applied by a brush or other mechanical mechanism. In various embodiments, the slurry may be applied by dipping, or submerging, the substrate in the slurry. In various embodiments, the slurry may be applied by flowing the slurry over and around the substrate.

At block 508, heat is applied to the substrate including the slurry. In various embodiments, the substrate, including the slurry, may be placed in a chemical vapor deposition (CVD) furnace (e.g., CVD furnace 102) and be heated to a first temperature. The first temperature may be about 1200° C. to about 2000° C., and more specifically, about 1400° C. to about 1800° C., and more specifically, about 1600° C. with an error of 5%. The reactant powder that is in the slurry reacts with the substrate in response to the first temperature. Specifically, the reactant powders turn to gas in response to the first temperature and the gas reacts with the carbon of the substrate to form SiC on the surface of the substrate. That is, the reaction causes a conversion of the reactant powder to form a first coating (e.g., first coating 130) over the substrate. During this process, the low-char solvent portion of the slurry may burn off, resulting in little to no solvent remaining on the substrate.

Figure 6:
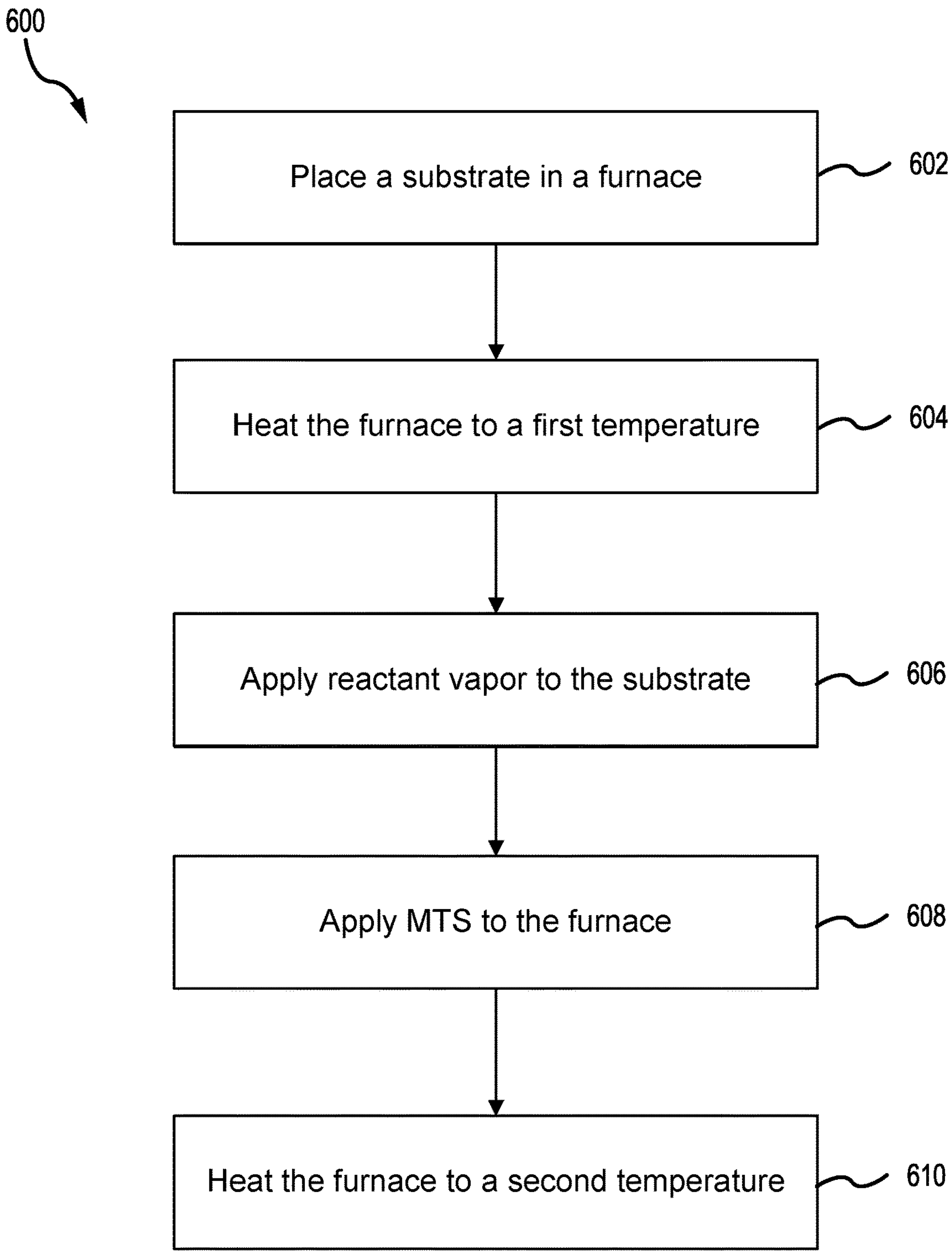
FIG. 6 illustrates a method for forming a coating on a substrate, in accordance with various embodiments.

Referring now to FIG. 6, a method 600 for forming a coating over a substrate is illustrated, in accordance with various embodiments. Method 600 may be performed using a chemical vapor deposition (CVD) system, such as system 100 or system 300 described above in FIGS. 1A, 1B, and 3. In various embodiments, the steps of method 600 may result in C/C material 200 described above in FIG. 2, including substrate 108, first coating 130, and second coating 140.

At block 602, a substrate is inside a furnace. In various embodiments, the furnace may be CVD furnace 102 described above in FIGS. 1A and 1B. In various embodiments, the furnace may be CVD furnace 302 described above in FIG. 3. In various embodiments, the substrate may be substrate 108 described above in FIGS. 1A and 1B. In various embodiments, the substrate may be substrate 308 described above in FIG. 3. In various embodiments, the substrate may be a simple shape such rectangular, circular, triangular, U-shaped, among others. In various embodiments, the substrate may be a complex shape including multiple different portions, angles, and surfaces. In various embodiments, the substrate may be a carbon-carbon (C/C) material.

At block 604, the furnace is heated to a first temperature. In various embodiments, the first temperature may be about 500° to about 1200° C., and more specifically, about 1000° C. The substrate warms as the furnace heats to the first temperature.

At block 606, a reactant vapor is applied to the surface of the substrate. In various embodiments, the reactant vapor may be generated by heating a reactant powder such as powder 118 described above in system 100. As described in system 100, the powder 118 may include silicon dioxide ($SiO_2$), a reducing agent such as activated carbon (C) or silicon (Si), and an oxygen getter, such as silicon carbide (SiC) to prevent in-situ oxidation of the substrate, or silicon nitride ($Si_3N_4$), among others. The reactant powder is heated to the first temperature causing the reactant powder to convert to a gas, as previously described. The gas, or reactant vapor, is flowed into the furnace and allowed to react with the substrate. The reactant vapor reacts with the carbon in the substrate to form a first SiC coating on the surface of the substrate.

In various embodiments, the reactant vapor may be generated by heating a tooling such as tooling 320 described above in system 300. In various embodiments, the tooling may include silicon dioxide ($SiO_2$), a reducing agent such as activated carbon (C) or silicon (Si), and an oxygen getter, such as silicon carbide (SiC) to prevent in-situ oxidation of the substrate, or silicon nitride ($Si_3N_4$), among others. As the furnace heats to the first temperature, the tooling produces the reactant vapor that surrounds the substrate and reacts with the substrate. The reactant vapor reacts with the carbon in the substrate to form a first SiC coating on the surface of the substrate.

At block 608, methyl trichlorosilane (MTS) is applied to the furnace. The MTS may be provided to the furnace via a secondary furnace (e.g., MTS furnace 306).

At block 610, the furnace is heated to a second temperature. The second temperature may be about 1200° C. to about 2000° C., and more specifically, about 1600° C. Heating the furnace to the second temperature allows for CVD SiC processing of the substrate to form the second coating over the substrate (e.g., second coating 140). This process, in various embodiments, reduces "touch time" of the substrate between steps and thereby improves the quality of the coating on the substrate. This, in turn, provides a C/C material with improved reliability.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Systems, methods, and apparatus are provided herein. In the detailed description herein, references to "one embodiment," "an embodiment," "various embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Numbers, percentages, or other values stated herein are intended to include that value, and also other values that are about or approximately equal to the stated value, as would be appreciated by one of ordinary skill in the art encompassed by various embodiments of the present disclosure. A stated value should therefore be interpreted broadly enough to encompass values that are at least close enough to the stated value to perform a desired function or achieve a desired result. The stated values include at least the variation to be expected in a suitable industrial process, and may include values that are within 5% of a stated value. Additionally, the terms "substantially," "about" or "approximately" as used herein represent an amount close to the stated amount that still performs a desired function or achieves a desired result. For example, the term "substantially," "about" or "approximately" may refer to an amount that is within 5% of a stated amount or value.

Furthermore, no element, component, or method step in the present disclosure is intended to be dedicated to the public regardless of whether the element, component, or method step is explicitly recited in the claims. No claim element herein is to be construed under the provisions of 35 U.S.C. 112 (f) unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

Finally, it should be understood that any of the above-described concepts can be used alone or in combination with any or all of the other above-described concepts. Although various embodiments have been disclosed and described, one of ordinary skill in this art would recognize that certain modifications would come within the scope of this disclosure. Accordingly, the description is not intended to be exhaustive or to limit the principles described or illustrated herein to any precise form. Many modifications and variations are possible in light of the above teaching.

What is claimed is:

1. A method for forming a bi-layer coating on a substrate, the method comprising:

placing the substrate in a chemical vapor deposition (CVD) furnace, the substrate including a surface;

applying a reactant vapor to the surface of the substrate to form a first coating;

applying methyl trichlorosilane (MTS) to the substrate after applying the reactant vapor to the substrate; and heating the CVD furnace, including the substrate, to a first temperature to form a second coating, wherein the first temperature is about 1600° C. to about 2000° C.

2. The method of claim 1, wherein the applying the reactant vapor further comprises:

placing a reactant powder in a gasification furnace;

heating the gasification furnace to a second temperature to form the reactant vapor; and starting, via at least one first valve between the gasification furnace and the CVD furnace, a first flow of the reactant vapor from the gasification furnace to the CVD furnace.

3. The method of claim 2, further comprising:

stopping, via the at least one first valve, the first flow of the reactant vapor from the gasification furnace to the CVD furnace; and starting, via a second valve between a MTS furnace and the CVD furnace, a second flow of the MTS to the CVD furnace to form the second coating.

4. The method of claim 2, wherein the reactant powder includes silicon dioxide ($SiO_2$), a reducing agent, and an oxygen getter.

5. The method of claim 1, wherein the applying the reactant vapor further comprises:

placing a tooling in the CVD furnace; and heating the CVD furnace to a second temperature to form the reactant vapor.

6. The method of claim 5, further comprising:

starting, via a second valve between a MTS furnace and the CVD furnace, a second flow of the MTS into the CVD furnace before heating the CVD furnace to the first temperature.

* * * * *